United States Patent
Modica et al.

(10) Patent No.: US 8,462,477 B2
(45) Date of Patent: Jun. 11, 2013

(54) JUNCTION FIELD EFFECT TRANSISTOR FOR VOLTAGE PROTECTION

(75) Inventors: Eric Modica, San Jose, CA (US); Edward J. Coyne, Limerick (IE); Derek F. Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 338 days.

(21) Appl. No.: 12/880,686

(22) Filed: Sep. 13, 2010

(65) Prior Publication Data

US 2012/0063049 A1 Mar. 15, 2012

(51) Int. Cl.
*H02H 3/20* (2006.01)
*H02H 3/24* (2006.01)
*H02H 9/04* (2006.01)

(52) U.S. Cl.
USPC .......................................... 361/90; 361/91.1

(58) Field of Classification Search
USPC ............................................................ 361/90
See application file for complete search history.

(56) References Cited

U.S. PATENT DOCUMENTS

| | | | |
|---|---|---|---|
| 3,521,087 A | 7/1970 | Lombardi | |
| 4,337,473 A | 6/1982 | Nishizawa | |
| 5,418,392 A | 5/1995 | Tanabe | |
| 5,543,643 A | 8/1996 | Kapoor | |
| 6,153,453 A * | 11/2000 | Jimenez | 438/200 |
| 2009/0134434 A1* | 5/2009 | Werner | 257/256 |
| 2009/0154039 A1* | 6/2009 | Tsugawa | 361/56 |

FOREIGN PATENT DOCUMENTS

| | | |
|---|---|---|
| EP | 0 058 975 | 10/1992 |
| EP | 0 508 975 A1 | 10/1992 |
| EP | 0660419 | 6/1995 |
| JP | 2000174035 | 6/2000 |
| WO | WO 2007/075759 | 7/2007 |

OTHER PUBLICATIONS

U.S. Appl. No. 12/611,052, filed Nov. 2, 2009, Daly et al.
2N3819, N-Channel RF Amplifier, Fairchild Semiconductor, Rev. A1, Dec. 2002.
AD524 Precision Instrumentation Amplifier. Analog Devices. 2007. 28 pages.
AMP02 High Accuracy Instrumentation Amplifier. Analog Devices. 2002. 12 pages.

(Continued)

*Primary Examiner* — Dharti Patel
(74) *Attorney, Agent, or Firm* — Knobbe, Martens, Olson & Bear, LLP

(57) ABSTRACT

Apparatus and methods are disclosed, such as those involving a junction field effect transistor for voltage protection. One such apparatus includes a protection circuit including an input, an output, and a JFET. The JFET has a source electrically coupled to the input, and a drain electrically coupled to the output, wherein the JFET has a pinch-off voltage (Vp) of greater than 2 V in magnitude. The apparatus further includes an internal circuit having an input configured to receive a signal from the output of the protection circuit. The protection circuit provides protection over the internal circuit from overvoltage and/or undervoltage conditions while having a reduced size compared to a JFET having a Vp of smaller than 2 V in magnitude.

22 Claims, 11 Drawing Sheets

OTHER PUBLICATIONS

Lapham et al. A Complementary Bipolar Process for High Speed Precision Linear Circuits. 1986 Bipolar Circuits and Technology Meeting, IEEE.

Wurcer et al. A Programmable Instrumentation Amplifier for 12b Resolution Systems. IEEE International Solid-State Circuits Conference, ISSCC 82, Feb. 10, 1982.

International Search Report and Written Opinion of the International Searching Authority mailed on Jan. 19, 2012 in International Application No. PCT/US2011/047798 filed Aug. 15, 2011, 8 pages.

Written Opinion of the International Searching Authority mailed on Sep. 19, 2012 in corresponding International Application No. PCT/US2011/047798 filed Aug. 15, 2011, 5 pages.

\* cited by examiner

JUNCTION FIELD EFFECT TRANSISTOR FOR VOLTAGE PROTECTION

BACKGROUND

1. Field

Embodiments of the invention relate to electronic devices, and more particularly, in one or more embodiments, to junction field effect transistors for voltage protection for electronic devices.

2. Description of the Related Technology

Certain electronic circuits can be exposed to overvoltage or undervoltage conditions. The overvoltage or undervoltage conditions can include, for example, electro static discharge (ESD) events arising from the abrupt release of charge from an object or person to an electronic system. Such overvoltage or undervoltage conditions can damage electronic circuits or adversely affect the operations of the circuits. Various protection circuits have been developed to provide protection over electronic circuits from overvoltage or undervoltage conditions.

Referring to FIG. 1, a conventional system including an internal circuit and a voltage protection circuit for protecting the internal circuit will be described below. The illustrated system 100 includes an internal circuit such as an amplifier circuit 110, a voltage protection circuit 120, a first node N1, and a second node N2. The amplifier circuit 110 includes an input configured to receive an input voltage signal $V_{IN}$ via the first node N1, the voltage protection circuit 120, and the second node N2.

The voltage protection circuit 120 serves to conduct the input voltage signal $V_{IN}$ during normal operation in which the input voltage signal $V_{IN}$ is within a selected range, for example, between rail voltages. If an overvoltage or undervoltage condition (in which the input voltage signal $V_{IN}$ is outside the selected range) occurs, the voltage protection circuit 120 reduces the input voltage signal $V_{IN}$ or blocks it from passing to the amplifier circuit 110, thereby protecting the amplifier circuit 110.

Referring to FIG. 2A, one example of a conventional voltage protection circuit will be described below. The illustrated protection circuit 200 can be at least part of the voltage protection circuit 120 of FIG. 1. The protection circuit 200 can include a first junction field effect transistor (JFET) 210, a second junction field effect transistor (JFET) 220, a first diode D1, a second diode D2, and first to third nodes N1-N3.

The first JFET 210 includes a source S1 electrically coupled to the first node N1, a drain D1 electrically coupled to the second node N2, and a gate G1 electrically coupled to the third node N3. The first JFET 210 serves as a primary device for conducting an input voltage signal $V_{IN}$ therethrough during normal operation while limiting the input voltage signal $V_{IN}$ when an overvoltage or undervoltage condition occurs.

The second JFET 220 includes a source S2 electrically coupled to the third node N3, a drain D2 electrically coupled to the second node N2, and a gate G2 electrically coupled to the third node N3. The second JFET 220 serves to recycle a gate current from the gate G1 of the first JFET 210. It is desirable to decrease the size of the second JFET 220.

The first diode D1 includes an anode coupled to the second node N2, and a cathode coupled to a first voltage rail $V_{cc}$. The second diode D2 includes an anode coupled to a second voltage rail $V_{EE}$, and a cathode coupled to the second node N2. The first and second diodes D1, D2 together serve as a clamping circuit.

It is common to look at device characteristics, for example, as shown in FIG. 2B, where the drain-source current $I_{DS}$ of a JFET is plotted as a function of the drain-source voltage $V_{DS}$ for various gate voltages $V_g$. As can be seen, for small $V_{DS}$, the drain—source current $I_{DS}$ rises rapidly in what is known as the "triode" region, generally indicated 10, in which the JFET functions like a resistor. However, as $V_{DS}$ increases, the JFET enters into the "pinch off" region at a pinch-off voltage Vp, generally designated 20, in which the $I_{DS}$ versus $V_{DS}$ family of curves are nominally horizontal so that the current is largely controlled by the gate voltage (this region of operation is also known as the "linear" region or mode). As the drain-source voltage $V_{DS}$ increases still further, then breakdown processes cause the drain-source current $I_{DS}$ to rise more rapidly again in response to increasing drain-source voltage $V_{DS}$.

Referring back to FIG. 2A, during normal operation, the first JFET 210 operates in the triode region, functioning like a resistor having a drain-source on resistance $R_{DSON}$ coupled between the first node N1 and the second node N2. As the drain-source on resistance $R_{DSON}$ increases, noise from the first JFET 210 also increases. Thus, it is desirable to reduce the drain-source on resistance $R_{DSON}$ by, for example, increasing the size of the first JFET 210.

In an undervoltage condition, in which the input voltage signal $V_{IN}$ is lower than the lower limit of the selected range, the first JFET 210 has both of its p-n junctions (source-gate and drain-gate junctions) reverse-biased, and operates like a resistor in the linear region 20 (see FIG. 2B). The second JFET 220 is reverse-biased with its gate-source voltage $V_{GS}$ equal to 0 V. The drain-source current $I_{DSS}$ of the second JFET 220 is smaller than the drain-source current $I_{DSS}$ of the first JFET 210, and is fed back to the second node N2, thereby recycling the gate current of the first JFET 210 to increase the current flowing through the second node N2.

In an overvoltage condition in which the input voltage signal $V_{IN}$ is higher than the upper limit of the selected range, the first JFET 210 operates as a PNP bipolar transistor (for a p-channel JFET). In an example in which the first JFET 210 is a p-channel JFET, a first p-n junction between the source S1 and the gate G1 is forward-biased, and a second p-n junction between the drain D1 and the gate G1 is reverse-biased, thereby generating a base current from the gate G1 that is beta times smaller than the collector current at D1 (where beta is a process-dependent current gain, from base to collector, of a bipolar transistor). The beta of JFET 210 operating as a bipolar transistor is poorly controlled, and can vary over a wide range of values, which in turn causes the overvoltage-current to vary similarly. To better control the overvoltage-current, the second JFET 220 is sized as small as the process rules allow, and acts to limit the base current coming from JFET 210. In this manner, the current flowing through JFET 210 in an overvoltage condition is limited by the maximum operating current of JFET 220 (IDSS).

SUMMARY

In one embodiment, an apparatus includes a protection circuit comprising an input, an output, and a junction field effect transistor (JFET), the JFET having a source electrically coupled to the input, and a drain electrically coupled to the output, wherein the JFET has a pinch-off voltage (Vp) of greater than 2 V in magnitude. The apparatus also includes an internal circuit having an input configured to receive a signal from the output of the protection circuit, wherein the internal circuit and the protection circuit are part of an integrated circuit, wherein the protection circuit is configured to protect the internal circuit from overvoltage and/or undervoltage conditions.

In another embodiment, an electronic device comprises a monolithic integrated circuit junction field effect transistor (JFET). The JFET comprises: a source; a drain; a top gate interposed between the source and the drain; a bottom gate underlying the source, the drain, and the top gate; and a channel defined horizontally between the source and the drain, and vertically between the top gate and the bottom gate, wherein the channel has a length (L) extending between the source and the drain, and a width (W) extending horizontally in perpendicular to the length, the width being the same as the horizontal length of an edge of the source or drain that faces the channel. The JFET has a pinch-off voltage (Vp) of greater than 2 V in magnitude, and a ratio of the width to the length (W/L) is smaller than 80.

In another embodiment, a method comprises forming a field effect transistor (JFET) having: a source; a drain; a top gate interposed between the source and the drain; a bottom gate underlying the source, the drain, and the top gate; and a channel horizontally between the source and the drain, and vertically between the top gate and the bottom gate, such that the JFET has a pinch-off voltage (Vp) of greater than 2 V in magnitude. The method further comprises forming an amplifier circuit having an input coupled to the drain of the JFET, such that the amplifier circuit and the JFET are part of an integrated circuit. Forming the JFET comprises forming the channel to have a greater depth than the depth of the channel of a JFET having a pinch-off voltage of lower than 2 V in magnitude.

DETAILED DESCRIPTION OF EMBODIMENTS

Figure 1:
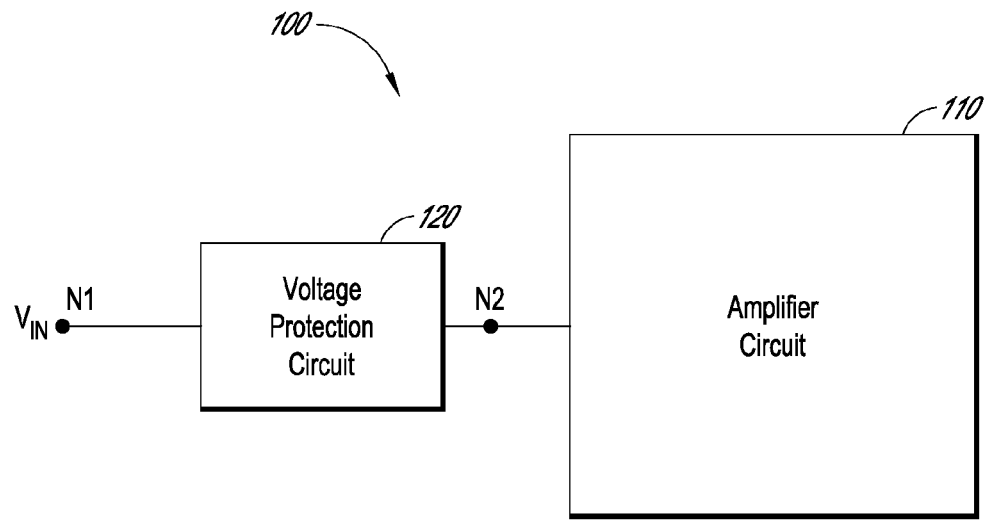
FIG. 1 is a schematic block diagram of a conventional system including an amplifier circuit and a voltage protection circuit.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a transistor are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

JFET with Reduced Size for Voltage Protection

Figure 2A:
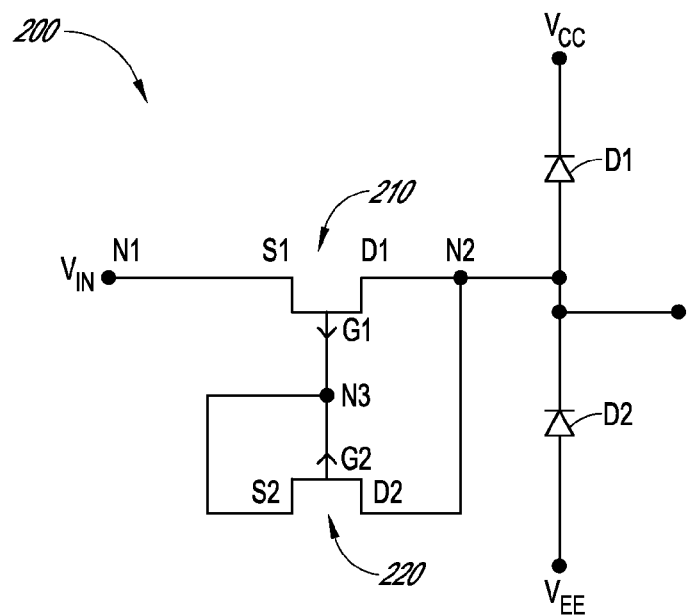
FIG. 2A is a circuit diagram of a conventional voltage protection circuit including junction field effect transistors (JFETs).
Figure 2B:
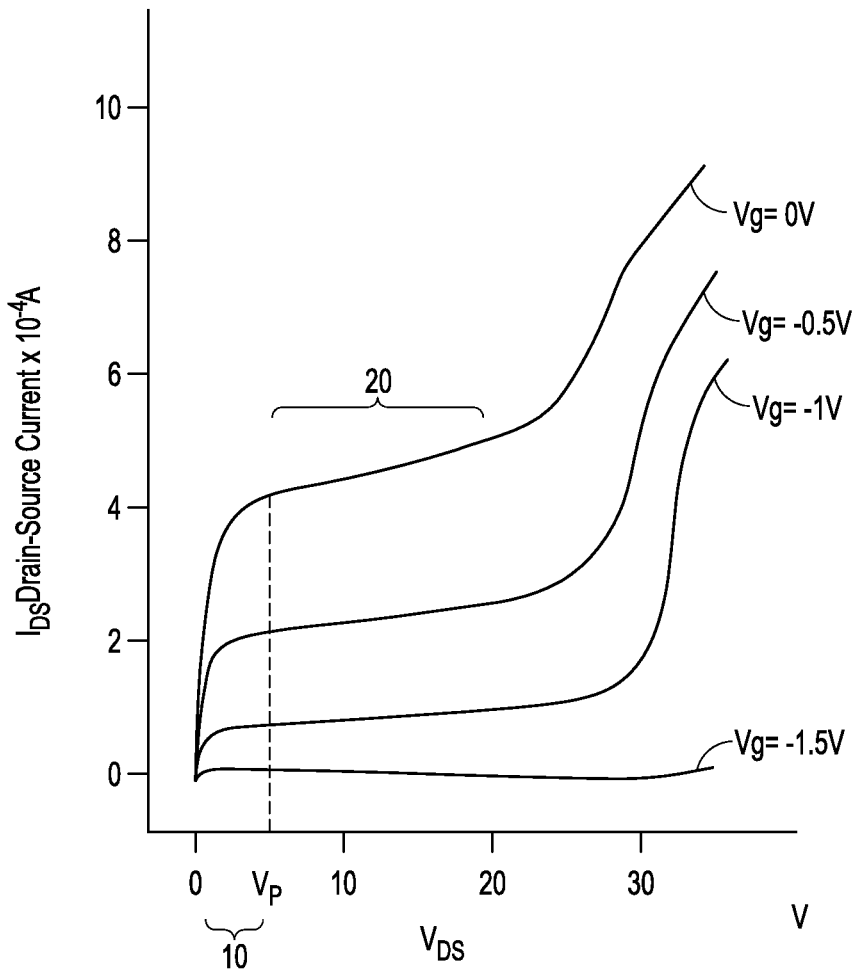
FIG. 2B is a graph illustrating a relationship between the drain-source voltage ($V_{DS}$) and the drain-source current ($I_{DS}$) of a JFET.

As described above, it is desirable to reduce the drain-source on resistance $R_{DSON}$ of a JFET for voltage protection (for example, the first JFET 210 of FIG. 2A). The drain-source on resistance $R_{DSON}$ can be reduced by, for example, increasing the size of the JFET. However, a JFET having an increased size occupies a large die area. As IC devices are reduced in size, such an increased size of JFET would not be desirable. Thus, there is a need for reducing the size of a JFET for voltage protection circuits without compromising over- and/or under-voltage protection capabilities.

In one embodiment, a JFET for voltage protection can include a source, a drain, a gate, and a channel. The channel has a width W and a length L. The JFET can be designed to have a pinch-off voltage greater than 2 V. As the pinch-off voltage Vp is increased, the width W of the channel can be reduced while the JFET has substantially the same over- and/or under-voltage protection capabilities.

Figure 3A:
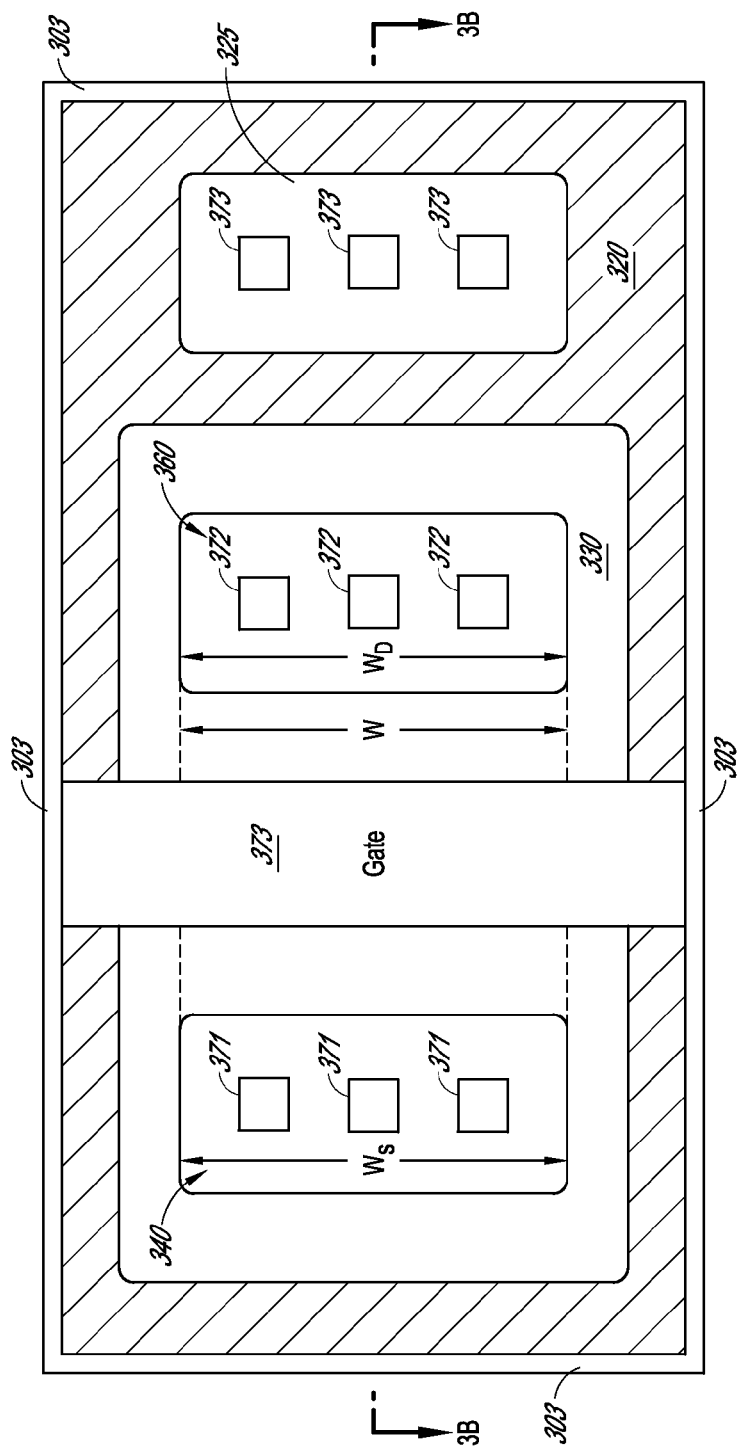
FIG. 3A is a schematic top plan view of a p-channel JFET for voltage protection according to one embodiment.
Figure 3B:
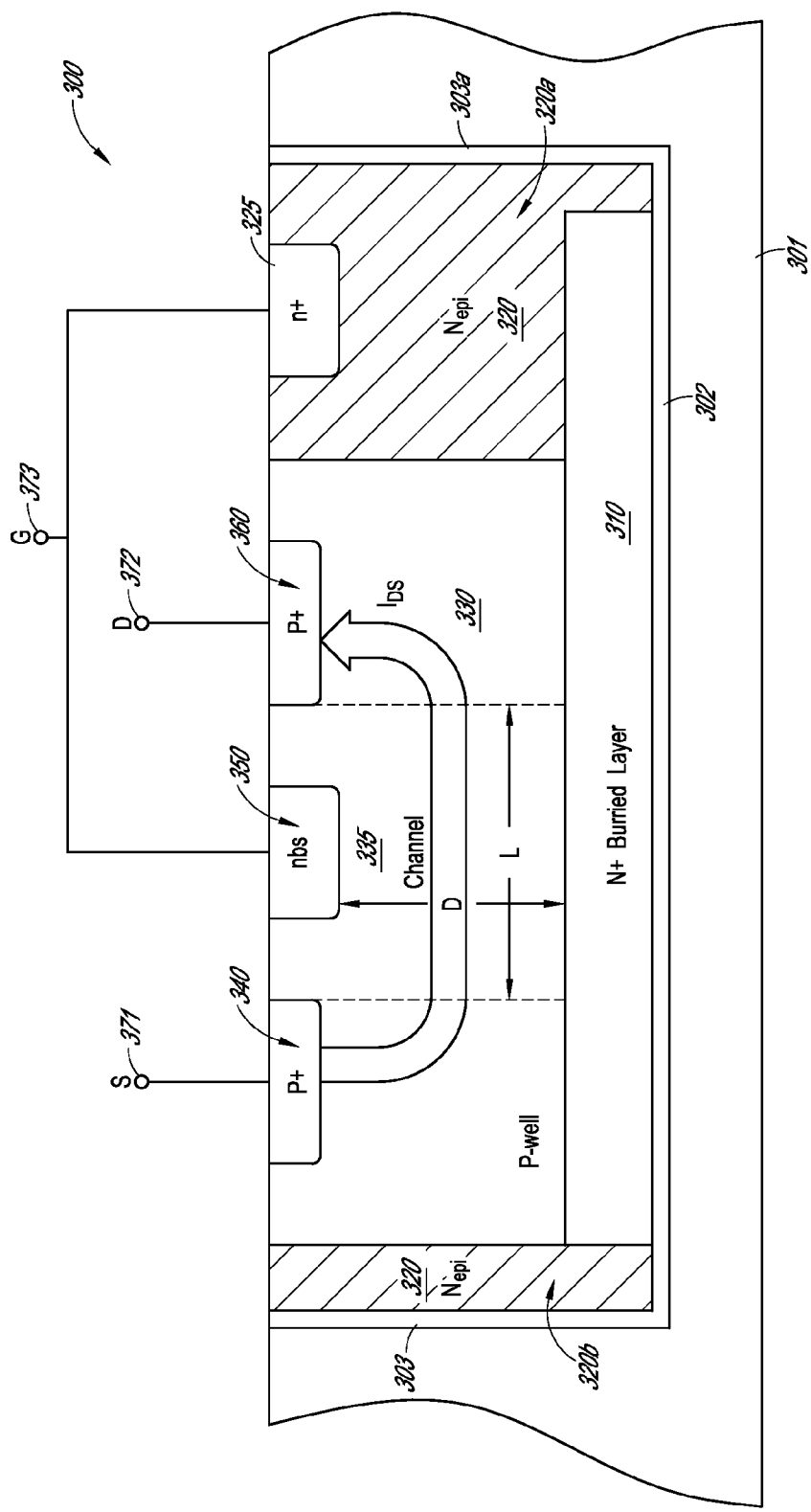
FIG. 3B is a cross-section of the JFET of FIG. 3A, taken along the line 3B-3B.

Referring to FIGS. 3A and 3B, one embodiment of a p-channel JFET for over- and/or under-voltage protection of an integrated circuit (IC) will be described below. FIG. 3A is a schematic top plan view of the JFET, and FIG. 3B is a cross-section of the JFET, taken along the line 3B-3B. The illustrated JFET 300 can form, for example, the first JFET 210 of FIG. 2A.

The JFET 300 shown in FIGS. 3A and 3B can be a silicon-on-insulator (SOT) isolated well device. As such, the JFET 300 sits in its own "island" of semiconductor material, which is formed in a well of insulation and is insulated from all other devices on the same monolithic integrated circuit. In this embodiment, a handle wafer 301 acts as a carrier substrate and has an insulating layer 302 of silicon dioxide formed thereon.

Side walls 303 (which also exist above and below the plane of the drawing) are also formed (typically of silicon dioxide) so as to isolate the island of silicon forming the JFET 300 in a well formed by the layer 302 and the side walls 303, and the insulating walls running above and below the plane of the drawing and parallel to it. The process for forming the layer 302 and the side walls 303 can be a conventional fabrication process. In other arrangements, the well of semiconductor material can be junction isolated.

The JFET 300 can include an N+ buried layer 310, an N epitaxial layer 320, a P-well 330, a p+ source region 340, a gate region 350, a p+ drain region 360, a source contact 371, a drain contact 372, and a gate contact 373. The N+ buried layer 310 is formed on the insulating layer 302, and includes n-type dopants.

The N epitaxial layer 320 is a layer epitaxially grown on the N+ buried layer 310. The N epitaxial layer 320 laterally surrounds the P-well 330 while the N+ buried layer 310 is formed below the P-well 330, such that the N epitaxial layer 320 and the N+ buried layer 310 together form a container shape.

In the cross-section (FIG. 3B) of the illustrated embodiment, the N epitaxial layer 320 includes a first portion 320a on the right side of the P-well 330, and a second portion 320b on the left side of the P-well 330. The N epitaxial layer 320 includes an n+ contact region 325 in the first portion 320. The n+ contact region 325 is highly doped with an n-type dopant, and includes a top surface exposed through the top surface of the first portion 320a. The gate contact 373 is electrically coupled to the n+ contact region 325. Thus, an electrical path is formed between the gate contact 373 and the N+ buried layer 310 such that the N+ buried layer 310 can serve as the back gate of the JFET 300.

The P-well 330 includes the source region 340, the gate region 350, and the drain region 360, each of which has a portion exposed through the top portion of the P-well 330. The source region 340 is a p+ region, and is closest to the second portion 320b of the N epitaxial layer 320. The drain region 360 is a p+ region, and closest to the first portion 320a of the N epitaxial layer 320. The gate region 350 is doped with an n-type dopant, and is interposed between the source region 340 and the drain region 360 while being spaced from the source and drain regions 340, 360. In one embodiment in which the JFET 300 is formed simultaneously with bipolar transistors, the gate region 350 can be formed simultaneously with the base (nbs) of a PNP bipolar transistor. The source region 340 includes one or more source contacts 371 which can be electrically coupled to, for example, the first node N1 of FIG. 2A. The gate region 350 can have an overlying metal contact 373 (FIG. 3A), which can be electrically coupled to the n+ contact region 325 in the first portion 320a of the N epitaxial layer 320. The drain region 360 includes one or more drain contacts 372 which can be electrically coupled to, for example, the second node N2 of FIG. 2A.

The P-well 330 also includes a channel 335 defined vertically between the gate region 350 and the N+ buried layer 310, and horizontally between the source region 340 and the drain region 360. The channel 335 has a length L extending between boundaries of the source region 340 and the drain region 360 that face the gate region 350, as shown in FIG. 3B, and a width W extending in a direction perpendicular to the length L when viewed from above the JFET 300, as shown in FIG. 3A. In the illustrated embodiment, the width W can be the same as the widths $W_S$, $W_D$ of the source and drain regions 340, 360 when viewed from above the JFET 300. The channel 335 also has a depth D defined between the boundaries of the gate region 350 and the N+ buried layer 310.

During operation, a gate voltage is applied to the gate region 350, and the same gate voltage is applied to the n+ contact region 325, which is electrically coupled to the N+ buried layer 310 through the N epitaxial layer 320. The gate voltage controls an amount of a drain-source current $I_{DS}$ flowing through the channel 335.

As described above in connection with FIG. 2A, the JFET 300 operates in the triode region at a gate voltage below the pinch-off voltage Vp, having a drain-source on resistance $R_{DSON}$. The drain-source on resistance $R_{DSON}$ is proportional to a ratio of the length to width (L/W) of the channel 335. In order to reduce the drain-source on resistance $R_{DSON}$, (for low noise applications), the width W should be increased or the length L should be decreased. As the length L can only be reduced to a certain limit (for example, about 10 μm), the width W should be increased to achieve a desired drain-source on resistance $R_{DSON}$. Such an increase in the width W increases the overall size of the JFET 300. Thus, there is a need for providing a scheme that can provide a JFET having a relatively low drain-source on resistance $R_{DSON}$ while minimizing an increase in the size of the JFET or even reducing the size of the JFET.

Applicants have recognized a relationship between that drain-source on resistance $R_{DSON}$ and pinch-off voltage Vp of a JFET, which can be represented by Equation 1 below. $R_{DSON}$ is the on resistance of a JFET in the triode region of operation.

$$R_{DSON}=Vp/(2\times I_{DSS}) \qquad \text{Equation 1}$$

In Equation 1, $I_{DSS}$ is the drain-source saturation current of the JFET, and can be represented by Equation 2 below.

$$I_{DSS}=(W/L)\times B'\times Vp^2 \qquad \text{Equation 2}$$

In Equation 2, B' is a transconductance parameter of the JFET relating to the processing of the JFET; W is the width of the channel of the JFET (see FIG. 3A); and L is the length of the channel of the JFET (see FIG. 3B). Thus, Equation 1 can be rewritten as expressed in Equation 3 below.

$$R_{DSON}=(L/W)/(2\times B'\times Vp) \qquad \text{Equation 3}$$

According to Equation 3, $R_{DSON}$ is inversely proportional to both W and Vp. W and Vp are substantially independent of each other. Thus, when Vp is increased, W can be reduced while achieving substantially the same $R_{DSON}$.

Assuming that L and B' are constant, if Vp is increased by two times, W can be reduced by half while achieving the same $R_{DSON}$. In reality, however, since B' is not constant with a change of Vp. Empirically, when Vp is increased by about 3.8 times, the width W of the channel 335 (FIG. 3B) can be reduced by 3 times while providing the same $R_{DSON}$. There is also an upper limit in increasing Vp because a JFET behaves like a resistor if Vp exceeds the upper limit.

Figure 4:
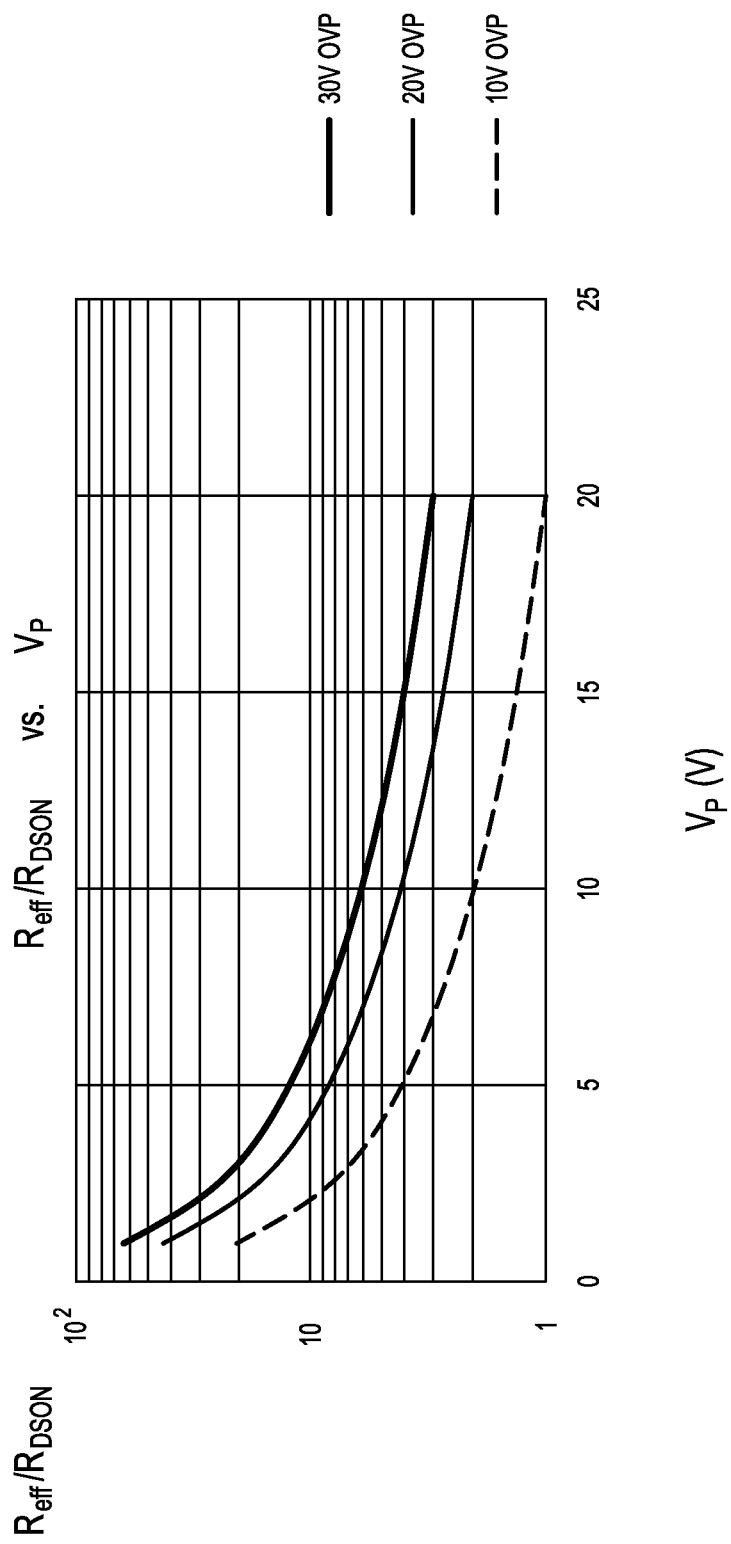
FIG. 4 is a graph illustrating a relationship between the pinch-off voltage Vp of a JFET and a ratio of equivalent resistance ($R_{FET}$) of the JFET to the drain-source on resistance $R_{DSON}$ of the JFET.

FIG. 4 is a graph illustrating a useful range of the pinch-off voltage Vp of a JFET. In the graph of FIG. 4, the x-axis represents absolute pinch-off voltage Vp in volts of a JFET, while the y-axis is a ratio of equivalent (or effective) resistance $R_{eff}$ (at various over-voltages) to $R_{DSON}$ for the JFET (that is, $R_{eff}/R_{DSON}$). The higher the ratio, the better a JFET should perform at limiting the overvoltage current. A ratio of 1 means that the JFET is no better at limiting current than an equivalently sized resistor.

The equivalent resistance $R_{eff}$ (at an overvoltage condition) of a JFET can be represented by Equation 4 below.

$$R_{eff}=Vov/I_{DSS} \qquad \text{Equation 4}$$

In Equation 4, Vov is a voltage at an overvoltage condition, and $R_{eff}$ is the series resistor that is needed to obtain the same current for the same overvoltage. According to Equation 1, $R_{DSON}=Vp/(2\times I_{DSS})$. Thus, the ratio of $R_{eff}$ to $R_{DSON}$ can be represented as in Equation 5 below, and as shown in FIG. 4.

$$R_{eff}/R_{DSON}=Vov/I_{DSS}\times(2\times I_{DSS})/Vp=Vov\times 2/Vp \qquad \text{Equation 5}$$

In FIG. 4, the y-axis is logarithmic scale, and represents a ratio of $R_{eff}/R_{DSON}$ of a JFET. The x-axis represents a pinch-off voltage Vp of the JFET (p-channel). The graph of FIG. 4 shows that, with a Vp of about 20 V at an overvoltage of 10V, the JFET is no better a current limiter than the equivalently-sized resistor since the above-described ratio is about 1. With a Vp of 5 V, the JFET is about 4 times better at current limiting than the equivalently-sized resistor, and even better at higher over-voltages. While illustrated in the context of p-channel JFETs and positive pinch-off voltages, the principles and advantages are applicable to n-channel JFETs and negative pinch-off voltages.

Figure 5:
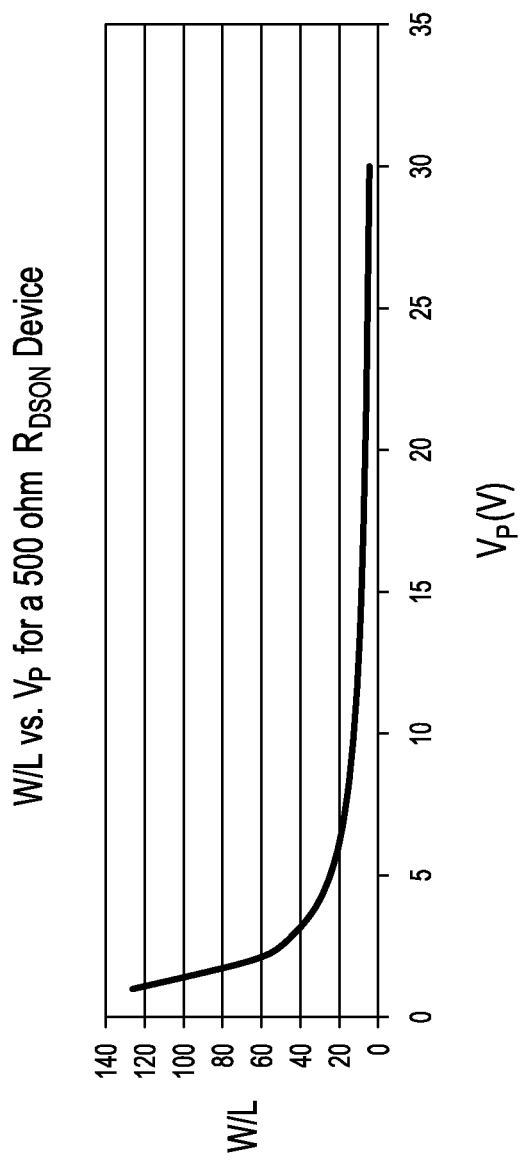
FIG. 5 is a graph illustrating relationship between the pinch-off voltage Vp of a JFET and a ratio of width to length of the channel of the JFET.

FIG. 5 is a graph illustrating a relationship between a ratio of width (W) to length (L) of the channel of a monolithic integrated circuit (IC) JFET and a pinch-off voltage Vp of the JFET. The graph of FIG. 5 is based on a JFET designed for providing an $R_{DSON}$ of about 500Ω. A skilled artisan will, however, appreciate that other JFETs having different $R_{DSON}$ values can have similar characteristics.

Conventional integrated circuit (IC) JFETs are typically designed to have a Vp of about 1 V to about 2V (p-channel JFET). However, Applicants have recognized that, as Vp increases, the ratio of W/L decreases, as shown in FIG. 5. Further, Applicants recognized that most of the size reduction of a JFET is achieved when Vp is at or near 5 V (or −5 V for n-channel JFET).

In view of FIGS. 4 and 5, a monolithic IC JFET can be optimized to provide an effective current limiting function while having a reduced size (particularly, the width W of the channel of the JFET) by selecting a pinch-off voltage Vp higher than those of conventional JFETs.

In one embodiment, a monolithic IC JFET can be fabricated to have a pinch-off voltage Vp greater than 2 V in magnitude (greater than 2 V for p-channel JFETs and less than −2 V for n-channel JFETs). For example, the pinch-off voltage Vp can be between about 2 V and about 30 V, or optionally between about 2.5 V and about 25 V. In another embodiment, a JFET can be fabricated to have a pinch-off voltage Vp between about 3 V and about 20 V, or optionally between about 3 V and about 15 V. In yet another embodiment, a JFET can be fabricated to have a pinch-off voltage Vp between about 3 V and about 10 V, between about 3 V and about 8 V, or between about 4 V and 7 V.

For example, the pinch-off voltage Vp can be any one selected from about 2.1 V, about 2.5 V, about 3.0 V, about 3.5 V, about 4.0 V, about 4.5 V, about 5.0 V, about 5.5 V, about 6.0 V, about 6.5 V, about 7.0 V, about 7.5 V, about 8.0 V, about 8.5 V, about 9.0 V, about 9.5 V, about 10.0 V, about 10.5 V, 11.0 V, about 11.5 V, about 12.0 V, about 12.5 V, about 13.0 V, about 13.5 V, about 14.0 V, about 14.5 V, about 15.0 V, about 15.5 V, about 16.0 V, about 16.5 V, about 17.0 V, about 17.5 V, about 18.0 V, about 18.5 V, about 19.0 V, about 19.5 V, about 20.0 V, or any voltage between two of the foregoing voltages, depending on the overvoltage condition from which the JFET is used for protection of a device. The pinch-off voltage Vp can be adjusted as will be described below in detail in connection with FIGS. 7, 8A-8C, and 9A-9C.

Figure 6A:
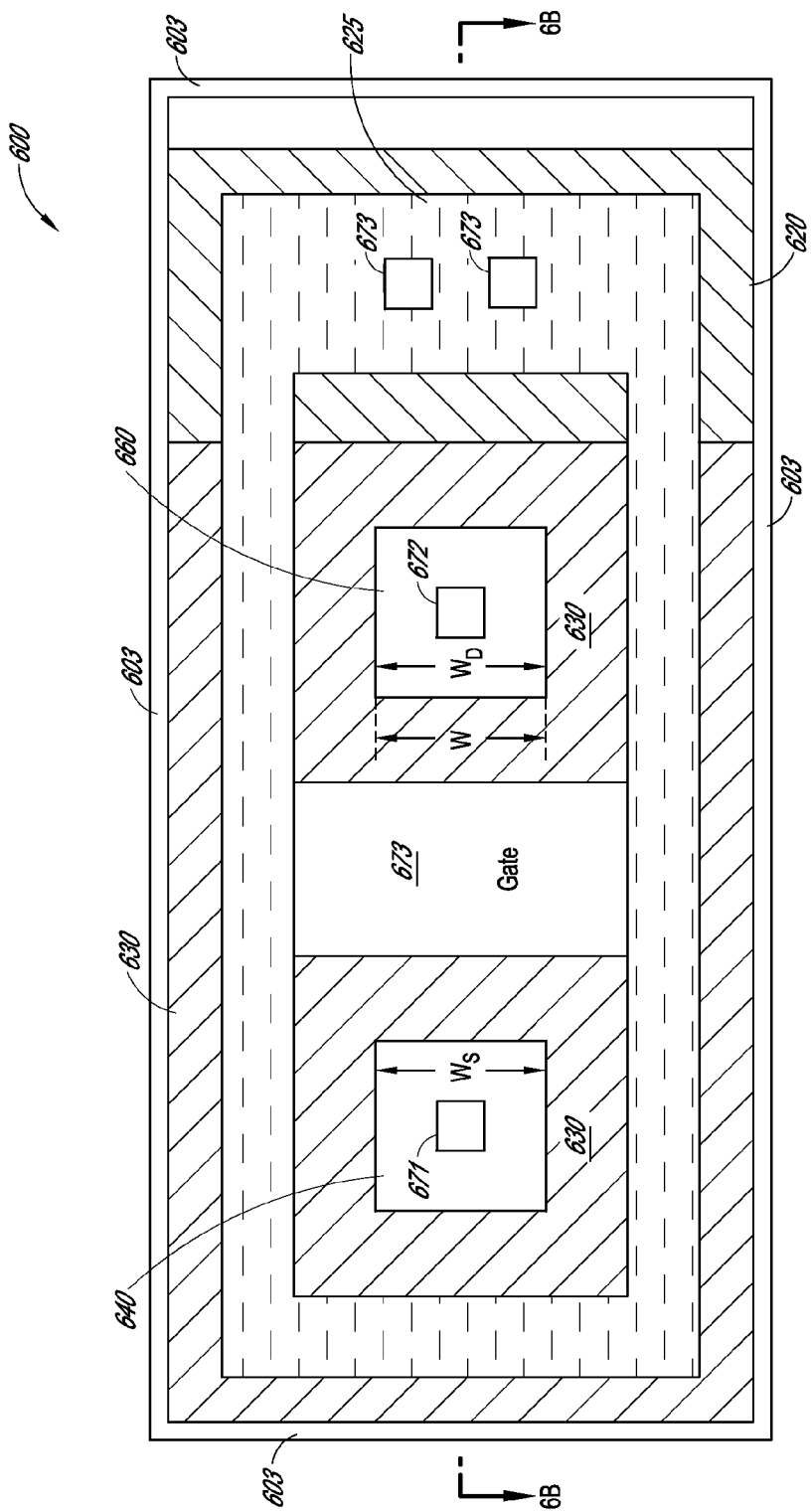
FIG. 6A is a schematic top plan view of an n-channel JFET for voltage protection according to another embodiment.
Figure 6B:
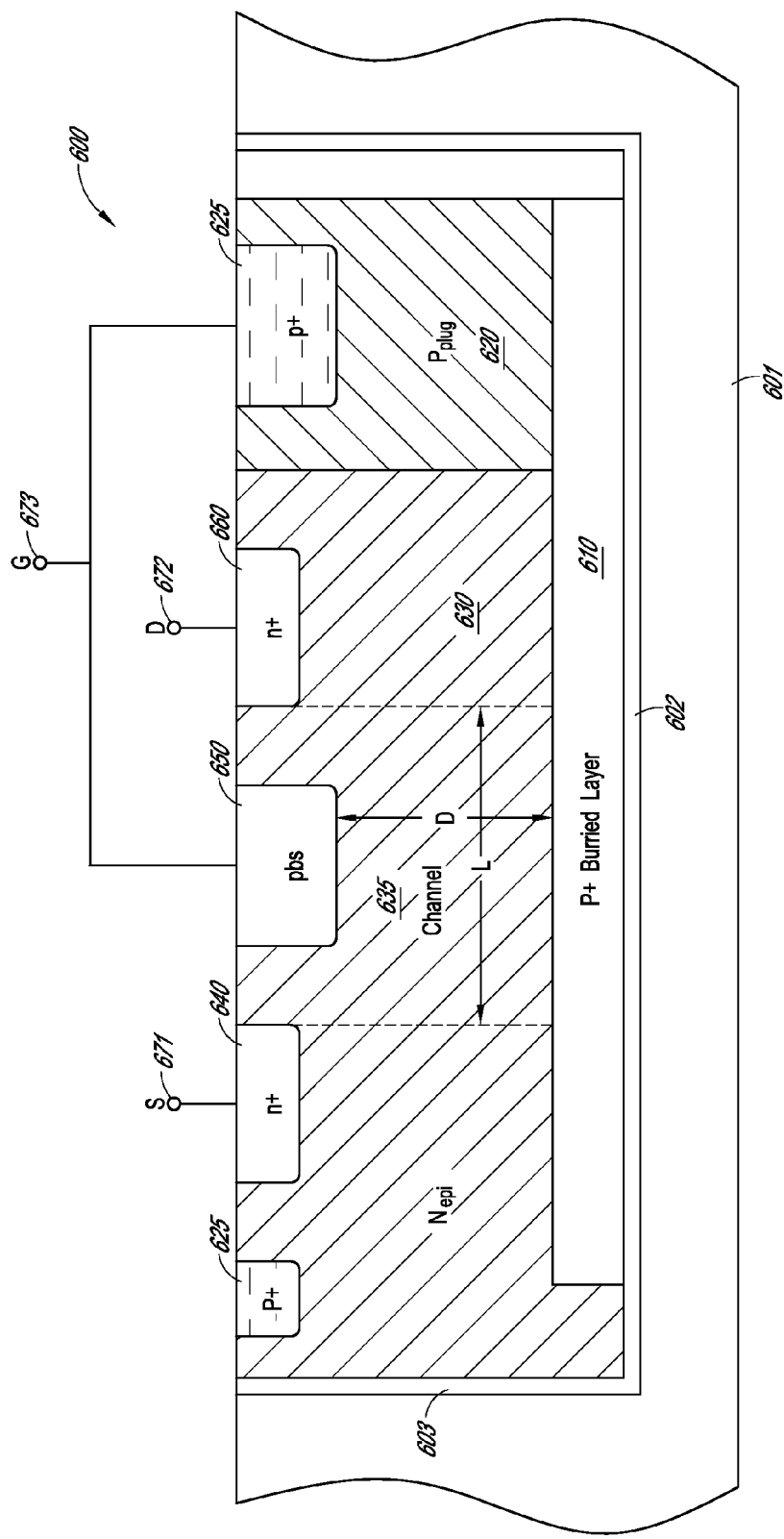
FIG. 6B is a cross-section of the JFET of FIG. 6A, taken along the line 6B-6B.

Referring to FIGS. 6A and 6B, one embodiment of a monolithic IC n-channel JFET for voltage protection will be described below. FIG. 6A is a schematic top plan view of the JFET, and FIG. 6B is a cross-section of the JFET, taken along the line 6B-6B. The illustrated JFET 600 can form, for example, the first JFET 210 of FIG. 2A.

Similar to the p-channel JFET of FIGS. 3A and 3B, the JFET shown in FIGS. 6A and 6B can be a silicon-on-insulator (SOI) isolated well device. In the illustrated embodiment, a handle wafer 601 acts as a carrier substrate and has an insulating layer 602 of silicon dioxide formed thereon. Side walls 603 are also formed (typically of silicon dioxide) so as to isolate the island of silicon forming the JFET 600 in a well formed by the layer 602 and the side walls 603. Other details of the wafer 601, the insulating layer 602, and the side walls 603 can be as described above in connection with those of the JFET 300 of FIGS. 3A and 3B.

The JFET 600 includes a P+ buried layer 610, a P plug 620, an N epitaxial layer 630, an n+ source region 640, a gate region 650, an n+ drain region 660, a p+ contact region 625, a source contact 671, a drain contact 672, and a gate contact 673. The P+ buried layer 610 is formed on the insulating layer 602, and includes p-type dopants.

The N epitaxial layer 630 is formed by a layer epitaxially grown on the P+ buried layer 610. In one embodiment, the JFET 600 of FIGS. 6A and 6B and the JFET 300 of FIGS. 3A and 3B can be formed on a single wafer, using the same fabrication process. In such an embodiment, the N epitaxial layer 630 of FIGS. 6A and 6B can be formed simultaneously with the N epitaxial layer 320 of FIGS. 3A and 3B.

The P plug 620 is formed through the N epitaxial layer 630 on a side of the JFET 600, as shown in FIG. 6B. The P plug 620 extends to contact the P+ buried layer 610 such that an electrical path is established from the p+ contact region 625 to the P+ buried layer 610. In certain embodiments, the JFET 600 can be formed simultaneously with bipolar transistors on a single wafer for a monolithic IC. In such embodiments, a PNP bipolar transistor can include a P plug that is a high-energy, high-dose implant that connects the PNP transistor collector pickup with a P+ buried layer in the PNP transistor. The P plug 620 of the JFET 600 can be formed simultaneously with the P plug of the bipolar transistor.

The p+ contact region 625 is formed to surround the source region 640, the gate region 650, and the drain region 660 when viewed from above, as shown in FIG. 6A. The p+ contact region 625 is embedded in the upper portion of the P plug 620 while a top portion of the p+ contact region 625 is exposed through the top surface of the P plug 620, as shown in FIG. 6B. The p+ contact region 625 is highly doped with a p-type dopant. Similar to the n+ contact region 325 of FIGS. 3A and 3B, the p+ contact region 625 may serve to provide the back gate of the JFET 600. The gate contact 673 is electrically coupled to the p+ contact region 625.

The source region 640, the gate region 650, and the drain region 660 are formed in the N epitaxial layer 630. Each of the regions 640-660 has a portion exposed through the top portion of the N epitaxial layer 630. The source region 640 is an n+ region, and is farthest from the P plug 620. The drain region 660 is an n+ region, and is closest to the P plug 620. The gate region 650 is doped with a p-type dopant, and is interposed between the source region 640 and the drain region 660 while being spaced from the source and drain regions 640, 660. In one embodiment in which the JFET 600 is formed simultaneously with bipolar transistors, the gate region 650 can be formed simultaneously with the base (pbs) of an NPN bipolar transistor. The source region 640 includes one or more source contacts 671 which can be electrically coupled to, for example, the first node N1 of FIG. 2A. The gate region 650 can have an overlying metal contact 673 (FIG. 6A), which can be electrically coupled to the p+ contact region 625 in the P plug 620. The drain region 660 includes one or more drain contacts 672 which can be electrically coupled to, for example, the second node N2 of FIG. 2A.

The N epitaxial layer 630 also includes a channel 635 defined vertically between the gate region 650 and the P+ buried layer 610, and horizontally between the source region 640 and the drain region 660. The channel 635 has a length L extending between the boundaries of the source region 640 and the drain region 660 that face the gate region 650, as shown in FIG. 6B, and a width W extending in a direction perpendicular to the length L when viewed from above the JFET 600, as shown in FIG. 6A. In the illustrated embodiment, the width W can be the same as the width $W_S$, $W_D$ of the source and drain regions 640, 660 when viewed from above the JFET 600. The channel 635 also has a depth D defined between the boundaries of the gate region 650 and the P+ buried layer 610.

During operation, a gate voltage is applied to the gate region 650, and the same gate voltage is applied to the p+ contact region 625, which is electrically coupled to the P+ buried layer 610 through the P plug 620. The gate voltage controls an amount of a drain-source current $I_{DS}$ flowing through the channel 635.

In designing the n-channel JFET 600 of FIGS. 6A and 6B, the same principles can be used to select a width W of the channel 635, and a pinch-off voltage Vp of the JFET 600. Other details of design principles can be as described above in connection with FIGS. 3A, 3B, 4, and 5.

Fabrication of a JFET Having a High Pinch-Off Voltage

Figure 7A:
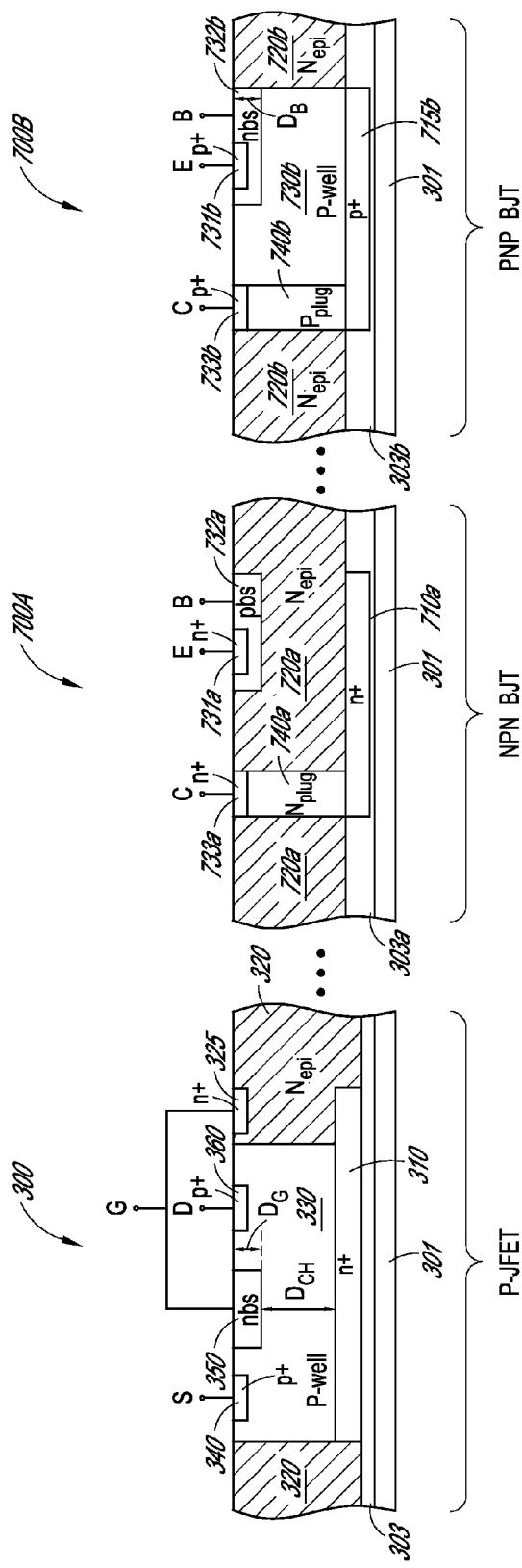
FIG. 7A is a cross-section of a JFET having a high pinch-off voltage formed simultaneously with bipolar transistors according to one embodiment.

Referring to FIG. 7A, a method of making a JFET having a high pinch-off voltage for a monolithic IC according to one embodiment will be described below. In the illustrated embodiment, a JFET can be formed using a complementary bipolar process. For example, a p-channel JFET 300 can be formed simultaneously with forming bipolar transistors, such as an NPN bipolar transistor 700A and a PNP bipolar transistor 700B.

The details of the structure of the JFET 300 can be as described above in connection with the JFET 300 of FIGS. 3A and 3B. The illustrated NPN bipolar transistor 700A and PNP bipolar transistor 700B are formed on the same substrate 301 as the JFET 300. The NPN bipolar transistor 700A includes an n+ buried layer 710a, an N epitaxial layer 720a, an emitter region (n+) 731a, a base region (pbs) 732a, a collector contact region (n+) 733a, and an N plug 740a. The PNP bipolar transistor 700B includes a p+ buried layer 715b, an N epitaxial layer 720b, a p-well 730b, an emitter region (p+) 731b, a base region (nbs) 732b, a collector contact region (p+) 733b, and a P plug 740b. A skilled artisan will appreciate that the structures of the bipolar transistors 700A, 700B can vary widely, depending on the design of the transistors.

In one embodiment, the bipolar transistors 700A, 700B can be formed as follows. First, n+ and p+ buried layer masks are implanted, and diffused into trench isolation 303a, 303b to form the n+ and p+ buried layers 710a, 715b, respectively. Then, the N epitaxial layer 720a, 720b (forming the NPN transistor collector) is grown, and the N+ and P+ plugs 740a, 740b are implanted. Subsequently, the P-well 730b, which forms the PNP transistor collector, is implanted. Then, thermal drive of the PNP transistor collector 733b and plug implants 740a, 740b is conducted. A field oxide (not shown) is grown on the above-described structure, and then partially stripped to form base openings. Then, the PNP and NPN transistor base implant and diffusions are performed to form the base regions 732a, 732b. The PNP and NPN transistor emitter implant and diffusions are performed to form the emitter regions 731a, 731b.

In the illustrated embodiment, at least some of the components of the JFET 300 can be formed simultaneously with components of the bipolar transistors 700A, 700B. For example, the n+ buried layer 310 of the JFET 300 can be formed simultaneously with the n+ buried layer 710a of the NPN bipolar transistor 700A. The P-well 330 of the JFET 300 can be formed simultaneously with the collector (P-well) 730b of the PNP bipolar transistor 700B. The source 340 and drain 360 of the JFET 300 can be formed simultaneously with the emitter 731b of the PNP bipolar transistor 700B. A skilled artisan will appreciate that various methods can be used for making components of the JFET 300 simultaneously with forming components of the bipolar transistors 700A, 700B.

Further, the gate region 350 of the JFET 300 can be formed simultaneously with the base region 732b of the PNP bipolar transistor 700B. Thus, the gate region 350 can have a depth $D_G$ that is substantially the same as the depth $D_B$ of the base region 732b of the PNP bipolar transistor 700B. The channel 335 of the JFET 300 has a depth $D_{CH}$. The resulting structures of the JFET 300 and the bipolar transistors 700A, 700B are shown in FIG. 7A.

By using a bipolar process as described above, the depth $D_{CH}$ of the channel 335 can be greater than that of the channel of a JFET formed by a CMOS process. By having such a deeper channel 335, the JFET 300 can have an increased pinch-off voltage Vp, compared to a JFET formed by a CMOS process.

Adjusting Pinch-Off Voltage of JFET

In the embodiments described above, the pinch-off voltage Vp of a JFET is increased to permit the reduction of the channel width W of the JFET while providing substantially the same overvoltage protection. The pinch-off voltage Vp of a JFET can be increased by using various methods or structures.

In some embodiments, the pinch-off voltage Vp of a JFET can be increased by increasing the depth of the channel of the JFET. The channel depth can be the primary factor in increasing the pinch-off voltage Vp. For shallow channels, the pinch-off voltage Vp can also be adjusted by having a different doping profile between the gate and the channel.

Figure 7B:
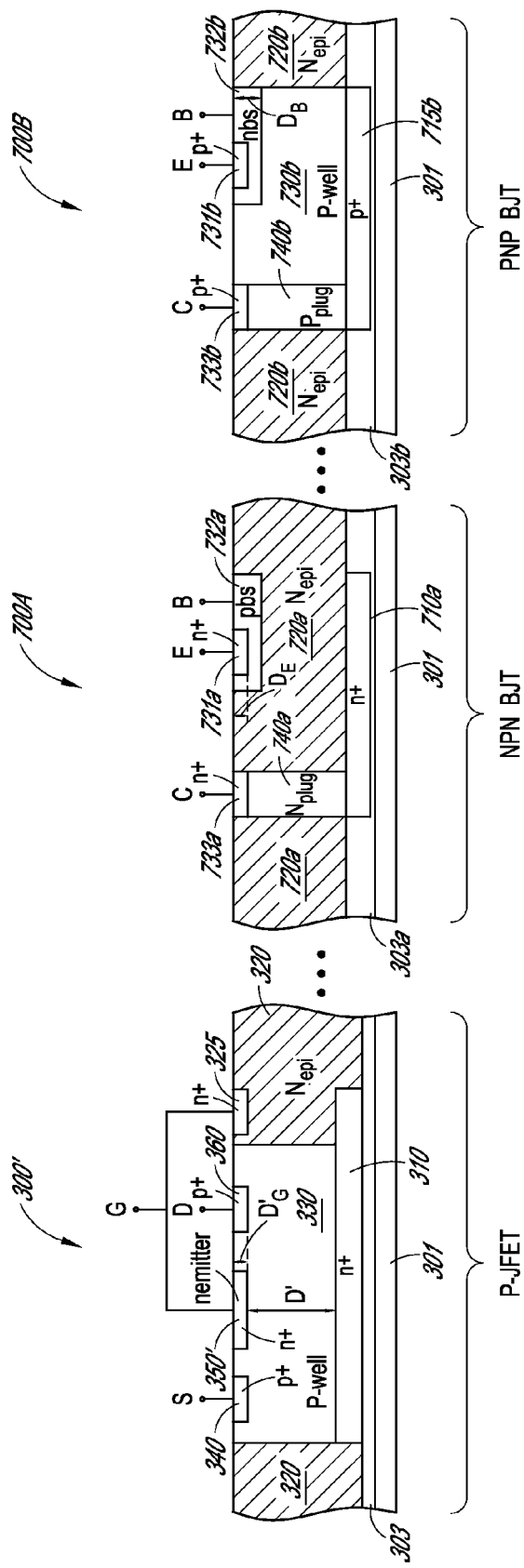
FIG. 7B is a cross-section of a JFET having an adjusted pinch-off voltage formed simultaneously with bipolar transistors according to another embodiment.

Referring to FIG. 7B, a method of adjusting the pinch-off voltage of a JFET according to one embodiment will be described below. In the illustrated embodiment, the gate region 350' of the JFET 300' can be formed simultaneously with the emitter region 731a of the NPN bipolar transistor 700A. Thus, the gate region 350 can have a depth $D_G'$ that is substantially the same as the depth $D_E$ of the emitter region 731a of the NPN bipolar transistor 700A. Other details of the process for making the structure of FIG. 7B can be as described above in connection with FIG. 7A.

The emitter region 731a of the NPN bipolar transistor 700A (having the depth $D_E$) is shallower than the base region 732b (having the depth $D_B$) of the PNP bipolar transistor 700B. Thus, in such an embodiment, the gate region 350' can be shallower than the gate region 350 of FIG. 7A which is formed simultaneously with the base region 732b of the PNP bipolar transistor 700B. With such a shallower gate region 350, the channel depth D' defined between the gate 350' and the n+ buried layer 310 is greater than the channel depth D of FIG. 7A, which can increase the pinch-off voltage of the JFET 300', compared to the JFET 300 of FIG. 7A.

Figure 8A:
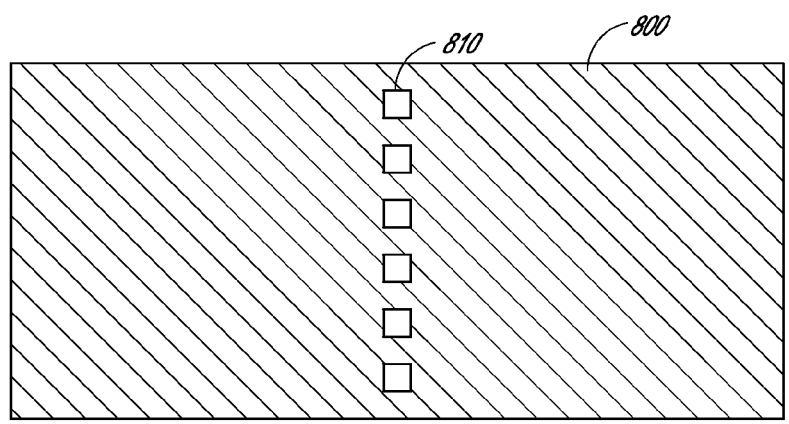
FIG. 8A is a schematic top plan view of a mask for doping for a P-well of a partially fabricated JFET for voltage protection according to yet another embodiment.
Figure 8B:
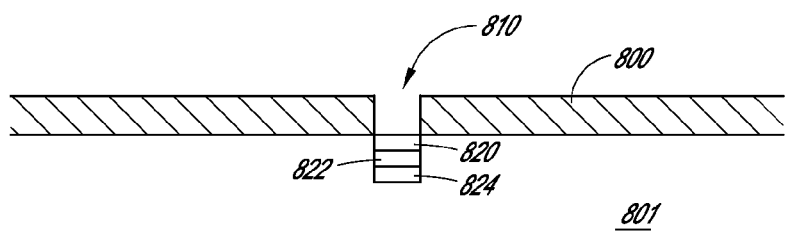
FIG. 8B is a cross-section showing the doping profile of the P-well of the partially fabricated JFET before thermal diffusion, taken along the line 8B-8B.
Figure 8C:
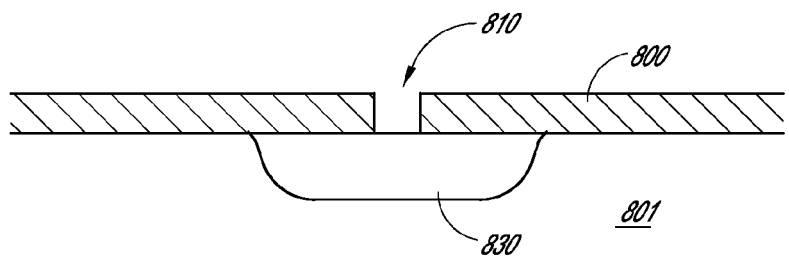
FIG. 8C is a cross-section showing the doping profile of the P-well of the partially fabricated JFET after thermal diffusion, taken along the line 8B-8B.

Referring to FIGS. 8A-8C, another embodiment of forming a JFET having a pinch-off voltage adjusted for overvoltage protection will be described below. In one embodiment, source limited diffusion with the P-well of a p-channel JFET can be used. For example, the P-well can be formed as small squares by implantation. Then, during a thermal drive, the amount of dopant will be limited, which reduces the effective P-well dose and hence adjust the pinch-off voltage Vp of the JFET. The thermal drive process is particularly effective with a p-channel JFET having a P-well because the large thermal budget of the thermal drive evens out irregularities in the profile of the P-well. The resulting structure effectively has a lighter channel doping, which causes the channel to deplete sooner, which decreases the pinch-off voltage Vp.

An example of the above-described source limited diffusion (or also referred to as "pixellation") for a drain region is disclosed in U.S. patent application Ser. No. 12/611,052, filed Nov. 2, 2009, the disclosure of which is incorporated herein by reference. In the above-identified application, small squares of diffusion are used to produce a lightly doped drain (LDD).

FIG. 8A illustrates a mask 800 for use in the above-described source limited diffusion process according to one embodiment. The mask 800 includes a plurality of smaller apertures 810. The apertures 810 can be located where the P-well of a JEFT is to be formed. In one embodiment, the apertures 810 in this example are about nominally 1 micron square and have their centers located at the center of the P-well that will be formed.

During the implantation step, for example, a p-type dopant is implanted into the semiconductor material (usually silicon) 801 beneath the apertures 810 in the mask 800, with the dopant concentration being greatest at the surface of the wafer and reducing with depth from the surface. As shown in FIG. 8B, regions 820, 822 and 824 exist beneath the apertures 810, but as the apertures 810 are small compared to a wider single aperture in a mask for forming a conventional P-well (for example, the P-well 330 of FIG. 3B), the dopants do not extend as deeply into the semiconductor material as compared to the wider aperture.

After implantation, the semiconductor is heat treated to cause the dopants to diffuse, as shown in FIG. 8C. The diffusion distance is a function of temperature and time, as well as concentration. As a result, the implantations beneath apertures 810 diffuse into one another, with the spaced apart apertures 810 giving rise to an extended region of reduced doping 830. The region of reduced doping 830 has reduced doping relative to the doping profile in the conventional P-well.

Because the doping extends to a lesser depth into the semiconductor material in the region of reduced doping 830, as compared to the conventional P-well, the number of doping atoms and the per area doping concentration in the region of reduced doping 830 is less than in the conventional P-well.

Thus, the resulting structure exhibits lightened the channel doping, which causes the channel to deplete sooner, which decreases the pinch-off voltage Vp. This embodiment can be used in combination with the method described above in connection with FIGS. 7A and 7B for adjusting the pinch-off voltage of a JFET.

In the embodiments described above, a JFET for over and/or under voltage protection can be optimized to have a reduced channel width by increasing the pinch-off voltage of the JFET. This configuration provides substantially the same over- and/or under-voltage protection capabilities as those having a longer channel width.

Applications

Thus, a skilled artisan will appreciate that the configurations and principles of the embodiments can be adapted for any devices that can be protected from over- or under-voltage conditions by the JFETs described above. The JFETs employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include circuits of optical networks or other communication networks, and disk driver circuits. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a protection circuit comprising an input, an output, and a junction field effect transistor (JFET), the JFET having a source electrically coupled to the input, and a drain electrically coupled to the output, wherein the JFET has a pinch-off voltage (Vp) of greater than 2 V in magnitude, wherein the JFET has a drain-source on resistance ($R_{DSON}$) when operating in the triode region of the JFET, wherein a relationship among W, L, Vp, and $R_{DSON}$ substantially satisfies $R_{DSON} = (L/W)/(2 \times B' \times Vp)$, wherein W is a width of a channel of the JFET, wherein L is a length of the channel of the JFET, and wherein B' is a transconductance parameter of the JFET; and
an internal circuit having an input configured to receive a signal from the output of the protection circuit, wherein the internal circuit and the protection circuit are part of an integrated circuit, wherein the protection circuit is configured to protect the internal circuit from overvoltage and/or undervoltage conditions.

2. The apparatus of claim 1, wherein the pinch-off voltage is between about 2.5 V and about 25 V in magnitude.

3. The apparatus of claim 1, wherein the pinch-off voltage is between about 3 V and about 15 V in magnitude.

4. The apparatus of claim 1, wherein the pinch-off voltage is between about 3 V and about 10 V in magnitude.

5. The apparatus of claim 1, wherein the pinch-off voltage is about 5 V in magnitude.

6. The apparatus of claim 1, wherein the JFET has an equivalent resistance ($R_{eff}$) at an overvoltage, and wherein a ratio of $R_{eff}$ to $R_{DSON}$ is greater than 1.

7. The apparatus of claim 6, wherein the width of the JFET is shorter compared to the width of another substantially similar JFET having a pinch-off voltage less than 2 V in magnitude while the JFET provides substantially the same drain-source on resistance ($R_{DSON}$) as the other JFET.

8. The apparatus of claim 7, wherein $R_{DSON}$ is about 500 ohms, and wherein a ratio of W to L (W/L) is smaller than 80.

9. The apparatus of claim 7, wherein the JFET includes a first gate, a second gate underlying the first gate,
wherein the channel of the JFET has a channel depth (D) defined between the first and second gates, and
wherein the channel depth of the JFET is greater compared to the channel depth of the other JFET.

10. The apparatus of claim 1, further comprising an NPN bipolar transistor formed on the same substrate as the JFET, wherein the NPN bipolar transistor has an emitter having a depth, and wherein the JFET has a gate having a depth substantially the same as the depth of the emitter.

11. The apparatus of claim 1, wherein the JFET is a p-channel JFET, and wherein the JFET comprises a silicon-on-insulator (SOI) isolated well device comprising:
an N+buried layer formed over a substrate;
a P-well formed on a portion of the buried layer;
an N epitaxial layer formed on another portion of the buried layer while laterally surrounding the P-well;
a source region formed in a first top portion of the P-well;
a drain region formed in a second top portion of the P-well;
a gate region formed in a third top portion of the P-well and interposed between the source and drain regions;
a contact region formed in a top portion of the N epitaxial layer, wherein the contact region is electrically coupled to the gate region; and
a channel defined vertically between the buried layer and the gate region, and horizontally between the source and drain regions.

12. The apparatus of claim 1, wherein the JFET is an n-channel JFET, and wherein the JFET comprises a silicon-on-insulator (SOI) isolated well device comprising:
a P+buried layer formed over a substrate;
a P plug formed on a portion of the buried layer;
an N epitaxial layer formed on another portion of the buried layer while laterally abutting the P plug;
a source region formed in a first top portion of the N epitaxial layer;
a drain region formed in a second top portion of the N epitaxial layer;
a gate region formed in a third top portion of the N epitaxial layer and interposed between the source and drain regions; and
a channel defined vertically between the buried layer and the gate region, and horizontally between the source and drain regions.

13. The apparatus of claim 12, wherein the JFET further comprises a contact region formed in a top portion of the P plug, wherein the contact region further extends to a top portion of the N epitaxial layer so as to laterally surround the source region, the drain region, and the gate region, and wherein the contact region is electrically coupled to the gate region.

14. The apparatus of claim 1, wherein the JFET further comprises a gate configured to receive a gate voltage at a potential between a first voltage rail and a second voltage rail.

15. The apparatus of claim 14, wherein the gate of the JFET is coupled to a first node, and wherein the protection circuit further comprises a second JFET having a second source electrically coupled to the first node.

16. An electronic device comprising:
a monolithic integrated circuit junction field effect transistor (JFET) comprising:
a source;
a drain;
a top gate interposed between the source and the drain;
a bottom gate underlying the source, the drain, and the top gate; and
a channel defined horizontally between the source and the drain, and vertically between the top gate and the bottom gate, wherein the channel has a length (L) extending between the source and the drain, and a width (W) extending horizontally in perpendicular to the length, the width being the same as the horizontal length of an edge of the source or drain that faces the channel, wherein the JFET has a pinch-off voltage (Vp) of greater than 2 V in magnitude, wherein a relationship among W, L, Vp, and $_{RDSON}$ substantially satisfies $R_{DSON}(L/W)/(2 \times B'Vp)$,
wherein $R_{DSON}$ is the drain-source on resistance of the JFET, and
wherein B' is the transconductance parameter of the JFET.

17. The device of claim 16, wherein the pinch-off voltage is between about 3V and about 10 V in magnitude.

18. A method of forming an integrated circuit, the method comprising:
forming, via a bipolar process, a junction field effect transistor (JFET) having:
a source;
a drain;
a top gate interposed between the source and the drain;
a bottom gate underlying the source, the drain, and the top gate; and
a channel horizontally between the source and the drain, and vertically between the top gate and the bottom gate, such that the JFET has a pinch-off voltage (Vp) of greater than 2 V in magnitude; and
forming an amplifier circuit having an input coupled to the drain of the JFET, such that the amplifier circuit and the JFET are part of an integrated circuit,
wherein forming the JFET comprises forming the channel to have a greater depth than the depth of the channel of another JFET having a pinch-off voltage of lower than 2V in magnitude.

19. The method of claim 18, wherein forming the amplifier circuit comprises forming an NPN bipolar transistor having an emitter on the same substrate as the JFET, wherein forming the JFET comprises forming the top gate of the JFET simultaneously with forming the emitter of the NPN bipolar transistor.

20. The method of claim 18, wherein forming the JFET comprises forming the channel by:
doping a dopant into a partially fabricated JFET to form a plurality of isolated regions when viewed from above the JFET; and
thermally diffusing the dopant such that the isolated regions are connected to one another.

21. The method of claim 18, wherein forming the JFET further comprises forming an epitaxial region around the source and the drain of the JFET.

22. The method of claim 18, wherein the JFET has a drain-source on resistance ($R_{DSON}$) when operating in the triode region, wherein the channel has a width (W) and a length (L), wherein a relationship among W, L, Vp, and $R_{DSON}$ substantially satisfies $R_{DSON} = (L/W)/(2 \times B' \times Vp)$, and wherein B' is the transconductance parameter of the JFET.

* * * * *

UNITED STATES PATENT AND TRADEMARK OFFICE
CERTIFICATE OF CORRECTION

PATENT NO. : 8,462,477 B2  
APPLICATION NO. : 12/880686  
DATED : June 11, 2013  
INVENTOR(S) : Modica et al.

Page 1 of 1

It is certified that error appears in the above-identified patent and that said Letters Patent is hereby corrected as shown below:

In the Claims

In column 14 at line 17, in Claim 16, change "$_{RDSON}$" to --$R_{DSON}$--.

In column 14 at line 18, in Claim 16, change "$R_{DSON}$" to --$R_{DSON}=$--.

Signed and Sealed this  
Fifth Day of November, 2013

Teresa Stanek Rea  
*Deputy Director of the United States Patent and Trademark Office*